United States Patent
Liu et al.

(10) Patent No.: US 7,403,430 B2
(45) Date of Patent: Jul. 22, 2008

(54) ERASE OPERATION FOR USE IN NON-VOLATILE MEMORY

(75) Inventors: Cheng-Jye Liu, Taoyuan County (TW); Chen-Chin Liu, Hsinchu (TW); Lan-Ting Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 346 days.

(21) Appl. No.: 11/354,951

(22) Filed: Feb. 16, 2006

(65) Prior Publication Data

US 2007/0189080 A1    Aug. 16, 2007

(51) Int. Cl.
*G11C 16/04* (2006.01)

(52) U.S. Cl. ............................ 365/185.33; 365/185.29; 365/185.24; 365/218; 711/103

(58) Field of Classification Search ............ 365/185.33, 365/185.29, 185.24, 218; 711/103
See application file for complete search history.

(56) References Cited

U.S. PATENT DOCUMENTS

| | | | | |
|---|---|---|---|---|
| 5,448,712 A | * | 9/1995 | Kynett et al. ................ | 711/103 |
| 6,222,770 B1 | * | 4/2001 | Roohparvar ............ | 365/185.19 |
| 6,279,070 B1 | * | 8/2001 | Jeong et al. ................. | 711/103 |
| 6,643,184 B2 | * | 11/2003 | Pio ........................ | 365/185.29 |
| 6,654,292 B2 | | 11/2003 | Keays | |

* cited by examiner

*Primary Examiner*—Richard T. Elms
*Assistant Examiner*—Eric Wendler
(74) *Attorney, Agent, or Firm*—Finnegan, Henderson, Farabow, Garrett & Dunner LLP (57) ABSTRACT

A sector erase method for use in a non-volatile memory, such as a FLASH memory, including a plurality of memory cells in rows and columns, the memory cells being divided into a plurality of sectors. The sector erase method includes erasing the memory cells of a first sector by applying successive erase pulses that increase in voltage magnitude or pulse width, until erasure of the first sector is verified. Erase condition information corresponding to the first sector, is recorded, this information including a number of times successive erase pulses are needed to be applied in order to erase the memory cells of the first sector. Memory cells of a next sector are erased by applying a first erase pulse having a voltage magnitude or pulse width determined from the recorded erase condition information. The first erase pulse may be incremented if the first erase pulse fails to erase that next sector.

17 Claims, 5 Drawing Sheets

ERASE OPERATION FOR USE IN NON-VOLATILE MEMORY

DESCRIPTION OF THE INVENTION

1. Field of the Invention

The present invention generally relates to a non-volatile memory and, more particularly, to a sector erase operation for use in a non-volatile memory.

2. Background of the Invention

Non-volatile memory is a type of memory that retains data even in the absence of power and without a periodic refresh of the stored data. A FLASH memory is a type of non-volatile memory. A typical FLASH memory includes a memory cell array in which memory cells are arranged in rows and columns. Each cell includes a floating gate field-effect transistor. The data stored in a cell depends on electrons in the floating gate of the cell. The data stored in a cell is altered by applying a strong electric field between the control gate and the source of the field-effect transistor to remove or accumulate the electrons in the floating gate. In an erase operation, electrons stored within the floating gate are removed to reduce the threshold voltage of the cell. In a program operation, electrons are accumulated in the floating gate to increase the threshold voltage of the cell.

Figure 1:
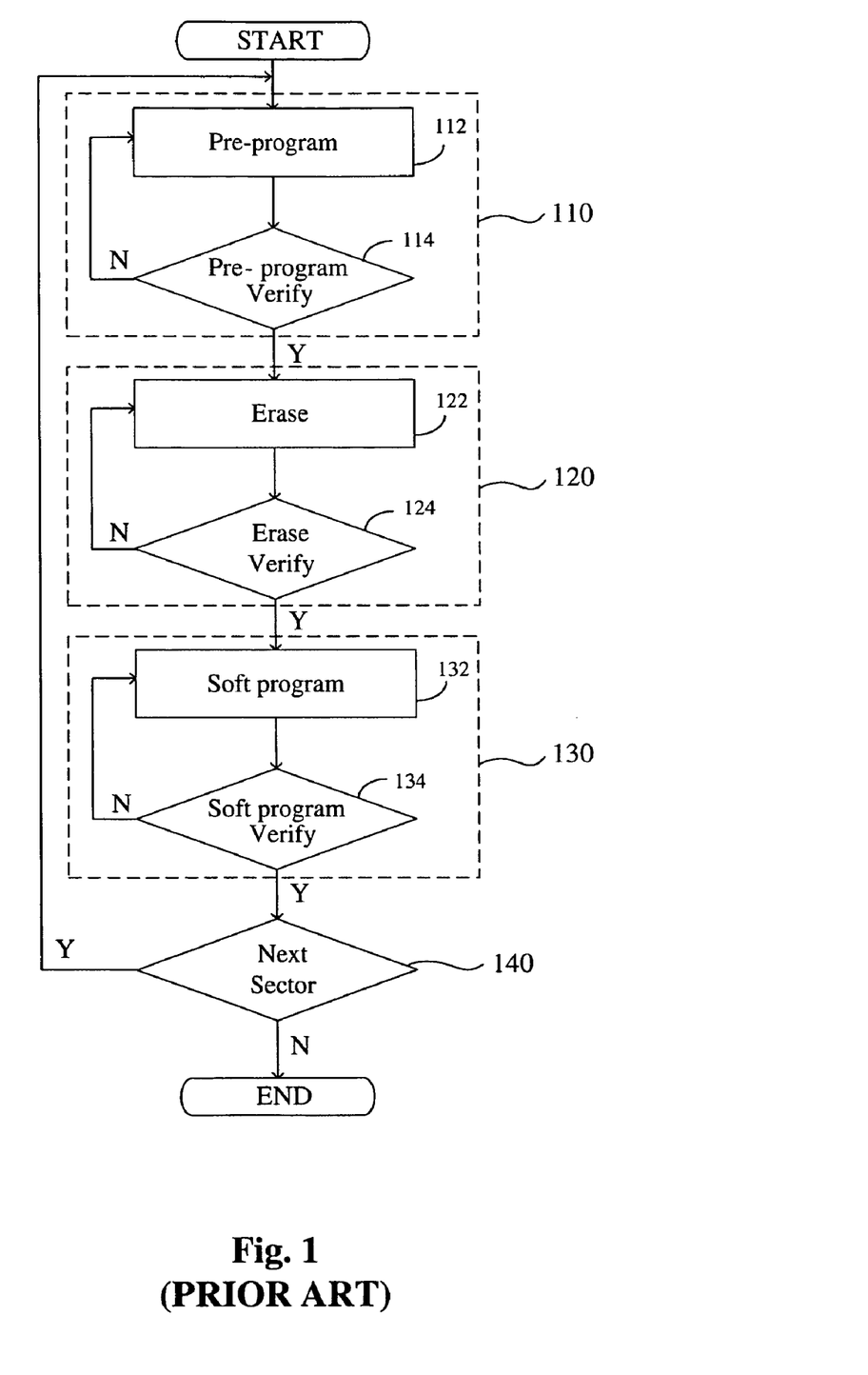
FIG. 1 is a diagram illustrating a flowchart of a conventional sector erase operation used in a FLASH memory.

FIG. 1 illustrates a flowchart of a conventional sector erase operation used in a FLASH memory. In FLASH memories, cells are erased in sectors. A sector represents a number of cells which can be erased simultaneously in an erase operation. A conventional erase operation for erasing a sector of cells generally includes a pre-program cycle 110, an erase cycle 120, and a soft program cycle 130. During pre-program cycle 110, the floating gates of all cells in a sector are programmed to have approximately the same amount of electrons so that all the cells in the sector have approximately the same threshold voltage. Pre-program cycle 110 includes a pre-program process 112 and a pre-program verify process 114. In pre-program process 112, a pre-program pulse is applied to all the cells in the sector. In pre-program verify process 114, all the cells in the sector are checked to verify that their threshold voltages are approximately the same after application of the pre-program pulse.

When the sector passes pre-program verify process 114, erase cycle 120 is performed. During erase cycle 120, all the cells in the sector are erased by applying an erase pulse to the control gates of all the cells in the sector to remove electrons from the floating gates of all the cells in the sector. Erase cycle 120 includes an erase process 122 and an erase verify process 124. In erase process 122, an erase pulse is applied to all the cells in the sector. In erase verify process 124, all the cells in the sector are checked to verify whether they pass erase verify process 124 after application of the erase pulse. If the number of the cells which pass erase verify process 124 is greater than or equal to a predetermined number, e.g., all the cells in the sector pass erase verify process 124, the sector is regarded as being erased successfully. If the sector fails to pass erase verify process 124, all the cells in the sector are erased again by applying another erase pulse. The magnitude of the latter erase pulse is larger than that of the previous erase pulse. Erase cycle 120 is performed successively until the sector being erased is regarded as passing erase verify process 124. This conventional sector erase operation is called a "voltage stepping" operation since the magnitude of the voltage level of a series of erase pulses successively applied to all the cells in the sector being erased is increased for each successive erase cycle 120 until the sector passes erase verify process 124.

In addition to the conventional "voltage stepping" operation, there is another kind of conventional sector erase operation called a "time stepping" operation which can also be used to erase cells in a sector of a FLASH memory during erase cycle 120. Erase cycle 120 includes erase process 122 and erase verify process 124. In erase process 122, an erase pulse is applied to all the cells in the sector being erased. In erase verify process 124, all the cells in the sector are checked to verify whether they pass erase verify process 124 after application of the erase pulse. If the number of the cells which pass erase verify process 124 is greater than or equal to a predetermined number, e.g., all the cells in the sector pass erase verify process 124, then the sector is regarded as being erased successfully. If the sector fails erase verify process 124, all the cells in the sector being erased are erased again by applying another erase pulse. In the conventional "time stepping" operation, the voltage level of the latter erase pulse is the same as that of the previous erase pulse but the pulse width of the latter erase pulse is larger than that of the previous erase pulse. Erase cycle 120 is performed successively until the sector passes erase verify process 124. The pulse width of a series of erase pulses applied to the cells being erased is increased for each successive erase cycle 120 until the sector passes erase verify process 124.

Since it is common that cells in the same sector have different threshold voltages, the required voltage of the erase pulse for erasing each cell in the sector is different. Applying an erase pulse with the largest magnitude or applying an erase pulse with the largest pulse width in order to erase one cell which has the highest threshold voltage among all the cells in the same sector, may cause too many electrons to be removed from the floating gates of other cells in the same sector. As a result, these cells become over-erased. An over-erased cell cannot be used to store data. Moreover, an over-erased cell can cause cells coupled to the same column to be regarded as erased cells, even though they may be programmed. Therefore, over-erased cells must be repaired.

After the sector being erased passes erase verify process 124, soft program cycle 130 is performed. During soft program cycle 130, over-erased cells in the sector are detected and repaired. Soft program cycle 130 includes a soft program process 132 and a soft program verify process 134. In soft program process 132, all the cells in the sector are detected to determine if any cell is over-erased. If an over-erased cell is detected, it is repaired by applying a soft-program pulse. In soft program verify process 134, all the cells in the sector are checked to determine whether there is any over-erased cell after the application of the soft-program pulse. If the number of over-erased cells in the sector is less than or equal to a predetermined number, e.g., zero, the sector is regarded as passing soft program verify process 134. If the sector fails to pass soft program verify process 134, soft program process 132 is performed again. Soft program cycle 130 is performed successively until the sector passes soft program verify process 134.

In step 140, if there is another sector which needs to be erased, pre-program cycle 110, erase cycle 120, and soft program cycle 130 of the conventional sector erase operation are performed in sequence to erase the sector. In this manner, the conventional "voltage stepping" or "time stepping" operation is performed to erase all sectors which need to be erased in the FLASH memory.

When a FLASH memory is erased in sectors by performing the conventional "voltage stepping" operation, the respective magnitudes of erase pulses applied in successive erase cycles 120 to each sector to be erased are fixed. For example, if the respective magnitudes of the erase pulses applied to sector 0 in successive erase cycles 120 are 3 volts, 4 volts, 5 volts, and 6 volts, the respective magnitudes of the erase pulses successively applied to sector 1 are also 3 volts, 4 volts, 5 volts, and 6 volts.

When a FLASH memory is erased in sectors by performing the conventional "time stepping" sector erase operation, the respective pulse widths of erase pulses applied in successive erase cycles 120 to each sector to be erased are fixed. For example, if the respective pulse widths of the erase pulses applied to sector 0 in successive erase cycles 120 are 500 us, 1 ms, 2 ms, and 4 ms, the respective pulse widths of the first four erase pulses successively applied to sector 1 are also 500 us, 1 ms, 2 ms, and 4 ms. The order of the pulse widths of erase pulses successively applied to each sector to be erased is fixed.

When performing conventional "voltage stepping" or "time stepping" operations, substantial time is required to successfully erase each sector to be erased by performing either a conventional "voltage stepping" operation or a conventional "time stepping" operation. There is thus a general need in the art for a sector erase method for use in a non-volatile memory to reduce the time and/or steps required to erase sectors of the non-volatile memory.

SUMMARY OF THE INVENTION

Consistent with the present invention, there is provided a sector erase method for use in a non-volatile memory including a plurality of memory cells in rows and columns, the non-volatile memory being divided into a plurality of sectors of the memory cells. The method includes erasing the memory cells of a first sector by applying a sequence of first erase pulses; recording erase condition information corresponding to the first sector, including a number of erase pulses of the sequence required to erase the memory cells of the first sector; determining an initial second erase pulse to erase the memory cells of a second sector according to the erase condition information; and erasing the memory cells of the second sector by, initially, applying the initial second erase pulse.

Also consistent with the present invention, there is provided a method for manufacturing a production non-volatile memory, each of the production memory and a sample non-volatile memory including a plurality of memory cells in rows and columns, the non-volatile memory being divided into a plurality of sectors of the memory cells. The method includes gathering erase testing information corresponding to a predetermined number of sectors of the sample non-volatile memory by erasing the memory cells of each of the predetermined number of sectors by applying a sequence of erase pulses applied to erase the memory cells of each sector, wherein the erase testing information includes a number of times, equal to a number of the erase pulses applied, that is required to erase the memory cells of each of the predetermined number of sectors of the sample non-volatile memory; and recording in the production non-volatile memory sample erase test result information including a least number of times required to erase any one of the predetermined number of sectors of the sample non-volatile memory.

Additionally consistent with the present invention, there is provided a method for erasing a production non-volatile memory, having stored in association therewith erase test result information of a sample non-volatile memory, each of the production memory and the sample memory including a plurality of memory cells in rows and columns and being divided into a plurality of sectors of the memory cells, the erase test result information including a number equal to a least number of erase pulses from a sequence of erase pulses required to erase any one of a predetermined number of the sectors of the sample non-volatile memory. The method includes determining an initial erase pulse to erase memory cells of a sector of the production memory according to the stored sample erase test result information; and erasing the memory cells of, at least, a predetermined one of the sectors of the production non-volatile memory by, initially, applying the initial erase pulse.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and, together with the description, serve to explain the principles of the invention.

DESCRIPTION OF THE EMBODIMENTS

Reference will now be made in detail to embodiments of the invention, which are illustrated in the accompanying drawings. Wherever possible, the same reference numbers will be used throughout the drawings to refer to the same or like parts.

Figure 2:
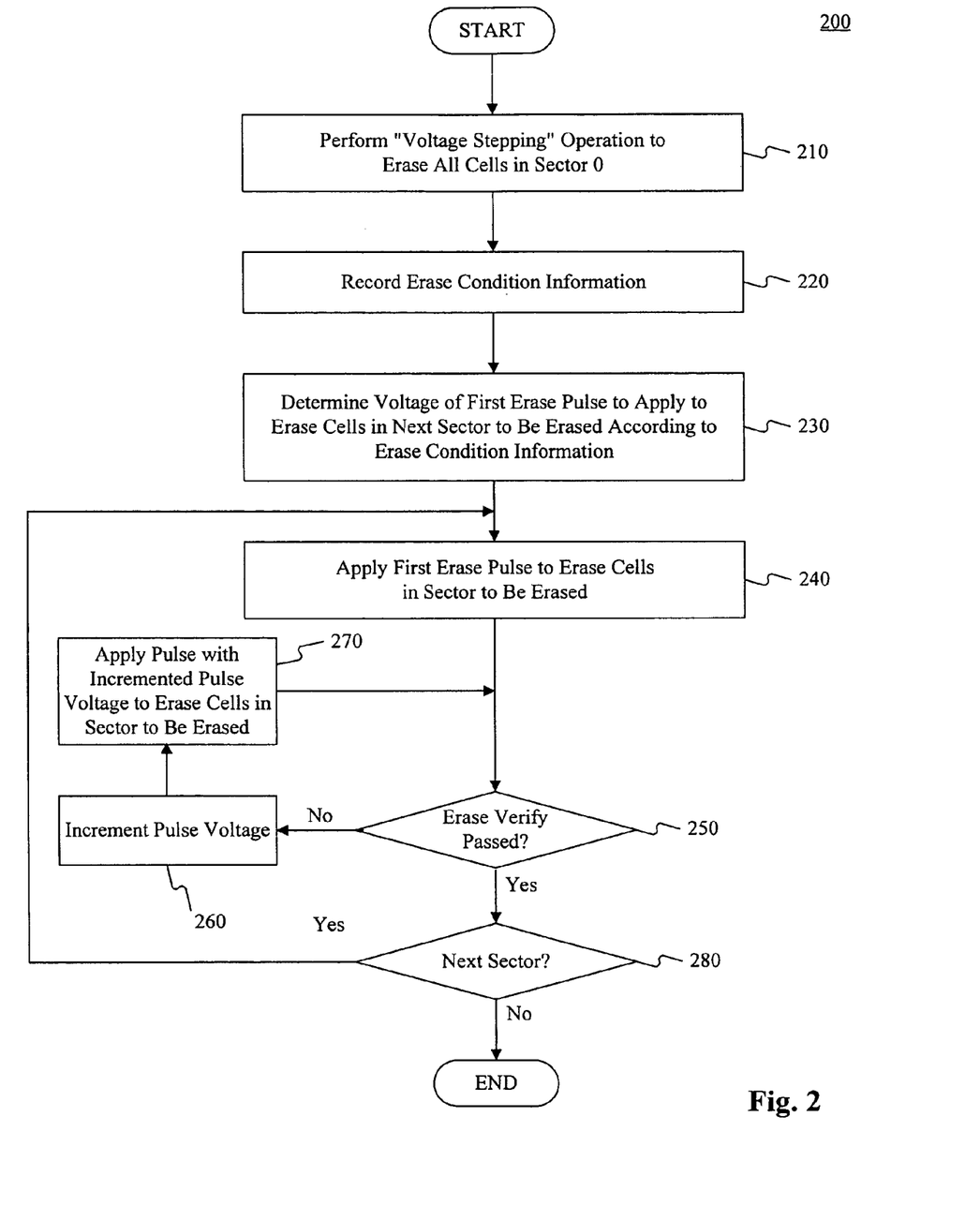
FIG. 2 is a diagram illustrating a flowchart of a sector erase operation used in a FLASH memory according to a first embodiment of the present invention.

FIG. 2 is a diagram illustrating a flowchart 200 of a "voltage stepping" sector erase operation used in a FLASH memory according to a first embodiment of the present invention. The FLASH memory includes a memory array divided into sectors. Each sector includes memory cells arranged in rows and columns.

In step 210, a "voltage stepping" operation is performed to erase all cells in a first sector, e.g., sector 0, of the FLASH memory. In the first embodiment, the "voltage stepping" operation is repeated until sector 0 passes an erase verify process, of the type described above for a conventional sector erase operation in which the number of cells passing the erase verify process is greater than or equal to a predetermined number. For example, the voltage stepping operation may need to be performed four times to successfully erase sector 0. The respective magnitudes of the erase pulses successively applied to sector 0 in the exemplary four voltage stepping operations are 3 volts, 4 volts, 5 volts, and 6 volts.

In step 220, erase condition information is recorded in, for example, a small memory block embedded in the product containing the FLASH memory, such small memory being volatile or non-volatile memory. The erase condition information includes the number of times required to perform the "voltage stepping" operation to erase all the cells in sector 0, which is represented by an integer N(x). In the present example, the number of times required to perform the "voltage stepping" operation is four. That number of erase pulses, four in the present example, or a maximum erase voltage, 6V in the present example, is recorded.

In step 230, the magnitude of the first erase pulse to be applied to a next sector, e.g., sector 1, is determined according to the erase condition information. When performing the "voltage stepping" operation to erase the next sector, e.g., sector 1, of the FLASH memory, the magnitude of the first erase pulse to be applied to erase sector 1 is determined based on the erase condition information, which is determined from successfully erasing sector 0. For example, the first erase pulse to erase sector 1, which is represented by an integer N(m), may be selected by subtracting an assumed integer value N(y), which represents sector-to-sector erase speed difference, from N(x), which represents the number of times required to perform the "voltage stepping" operation to erase sector 0. In the example described above, N(x) is four since four voltage stepping operations were required to successfully erase sector 0. N(y) is set to be one. In this condition, N(m) is determined to be 3, i.e., 4-1, which means that the third erase pulse applied to erase sector 0 is selected to be the first erase pulse applied to erase sector 1.

In step 240, when performing the "voltage stepping" operation to erase all the cells in sector 1, the magnitude of the first erase pulse applied to erase sector 1 is 5 volts, which is the same as the third erase pulse applied to erase sector 0. After that first 5 volt erase pulse is applied to sector 1, sector 1 is subjected to the erase verify process. (step 250) If sector 1 does not pass the erase verify process, the pulse voltage is incremented (step 260), e.g., to 6 volts, and a pulse with the incremented pulse voltage is applied to all of the cells of sector 1 (step 270). In accordance with the first embodiment, it is expected that sector 1 will be successfully erased after applying the second erase pulse, so that the total number of pulses required to erase sector 1 is fewer than the number required to erase sector 0. Nevertheless, sector 1 is subjected to the erase verify process after applying the second erase pulse and if sector 1 fails, the pulse voltage would again be incremented and sector 1 would be subjected to a third erase pulse, e.g., 7 volts.

If there are other sectors that need to be erased, e.g., sector 2, . . . , sector N, in the FLASH memory (step 280), the first erase pulse to be applied, i.e., the pulse corresponding to N(m) (step 230), in the present example 5 volts, is applied. (step 240) Again, after the first erase pulse is applied, the sector being erased will be subjected to the erase verify process. (step 250) If the sector fails the erase verify process, the erase pulse voltage will be incremented (step 260) and a pulse with the incremented pulse voltage is applied to all of the cells in the sector to be erased (step 270). This process will continue until the sector passes the erase verify process. However, the inventors have found that the number of voltage pulses for each sector being erased after sector 0, will be fewer than the number of voltage pulse required to erase sector 0.

If it is determined at step 280 that there are no other sectors to be erased, the erase operation ends.

It is noted that N(y) is constant for all sectors that need to be erased in the same FLASH memory. However, N(y) may be different for different FLASH memories due to process variations which may be different from wafer to wafer. Also, since N(x) represents the number of times required to perform the "voltage stepping" operation on the first sector of the FLASH memory, its value remains constant for other sectors to be erased.

Figure 3:
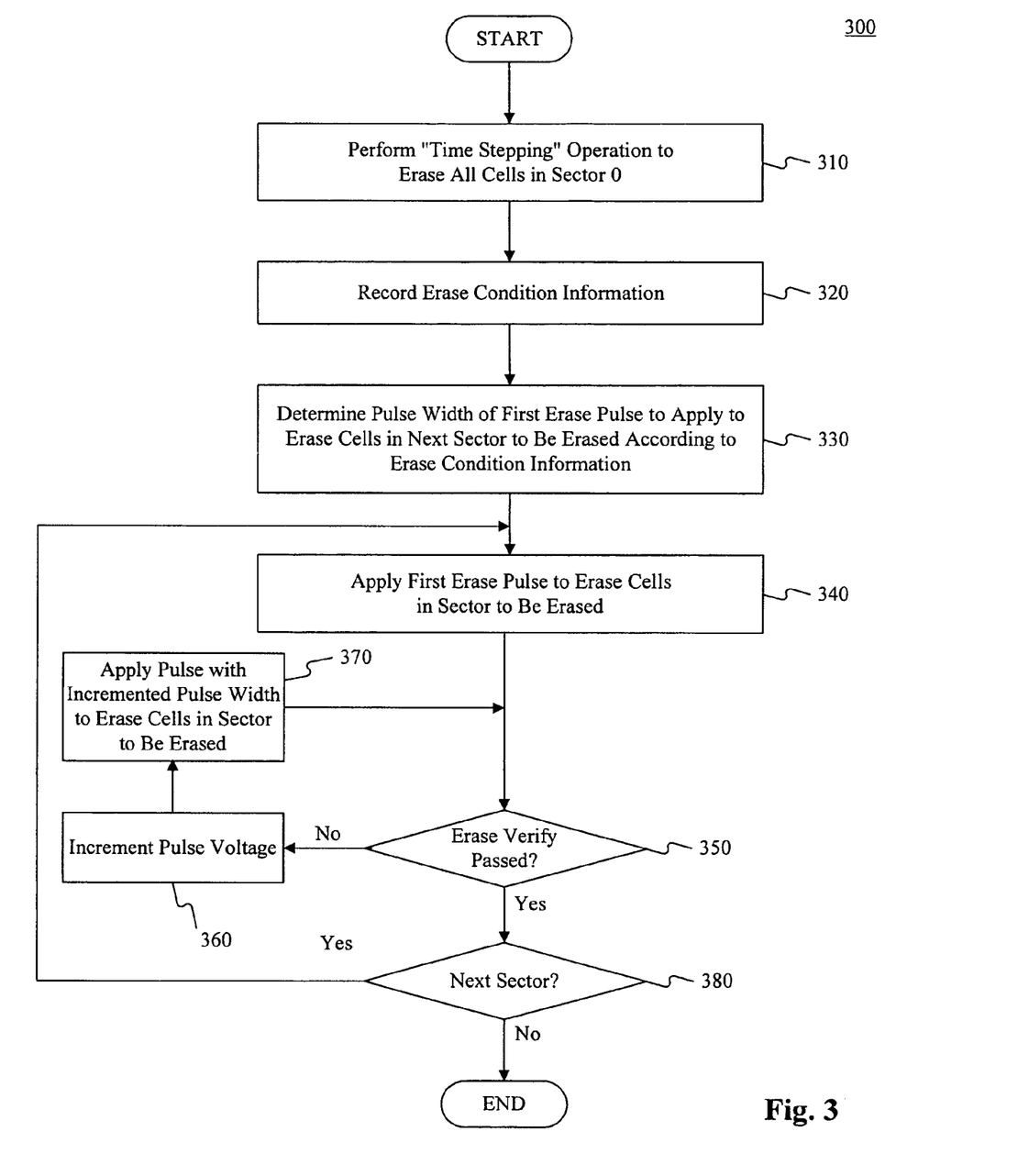
FIG. 3 is a diagram illustrating a flowchart of a sector erase operation used in a FLASH memory according to a second embodiment of the present invention.

FIG. 3 is a diagram illustrating a flowchart 300 of a "time stepping" sector erase operation used in a FLASH memory according to a second embodiment of the present invention. In the second embodiment, a "time stepping" operation is performed to erase the first sector, e.g., sector 0, of a FLASH memory.

In step 310, the time stepping operation is repeated until sector 0 passes an erase verify process, of the type described above for a conventional sector erase operation, in which the number of cells passing the erase verify process is greater than or equal to a predetermined number. For example, the time stepping operation may need to be performed four successive times to successfully erase sector 0. In accordance with the time stepping operation, the pulse width in each successive operation is incremented in a predetermined manner. In the present example in which four successive operations are needed, the respective pulse widths of these operations may be 500 us, 1 ms, 2 ms, and 4 ms. In the present example, the pulse widths of the series of erase pulses applied to all the cells being erased increases by doubling the last pulse applied, although other rates of increase may be used. In step 320, erase condition information is recorded in a small memory block embedded in the product containing the FLASH memory, after erasing sector 0 of the FLASH memory. The erase condition information includes the number of times required to perform the "time stepping" operation to successfully erase sector 0, which is represented by an integer S(x). In the present example, the number of times S(x) required to perform the "time stepping" operation is four. So the number of erase pulses, four in the present example, is recorded.

In step 330, the pulse width of the first erase pulse to be applied to a next sector, e.g., sector 1, is determined based on the erase condition information, which is determined from successfully erasing sector 0. For example, the first erase pulse to erase sector 1, which is represented by an integer S(m), may be selected by subtracting an assumed integer value S(y), which represents sector-to-sector erase speed difference, from S(x), which represents the number of times required to apply successively increasing pulse widths in order to erase sector 0. In the present example, S(x) is four and S(y) is set to be one. In this condition, S(m) is determined to be 3, i.e., 4-1, which means that the third erase pulse applied to erase sector 0 is selected to be the first erase pulse to erase sector 1.

In step 340, when performing the "time stepping" operation to erase all the cells in sector 1, the pulse width of the first erase pulse applied to erase sector 1 is 2 ms, which is the same as the pulse width of the third erase pulse to erase sector 0, because S(m) is 3. After that first 2 ms erase pulse is applied to sector 1, sector 1 is subjected to the erase verify process (step 350). If sector 1 does not pass the erase verify process, the pulse width is incremented (step 360) to the next pulse width according to the same predetermined rate of increase of pulse widths applied to erase sector 0. Thus, in the present example, the pulse width would be incremented to 4 ms and a pulse with the incremented pulse width is applied to all of the cells of sector 1 (step 370). In accordance with the second embodiment, it is expected that sector 1 will be successfully erased after applying the second erase pulse, so that the total number of pulses required to erase sector 1 is lower than the number of pulses required to erase sector 0. Nevertheless, sector 1 is subjected to the erase verify process after applying the second erase pulse and if sector 1 fails, it would be subjected to a third erase pulse, e.g., an 8 ms pulse.

If there are other sectors that need to be erased, e.g., sector 2, ..., sector N, in the FLASH memory (step 380), the first erase pulse, i.e., the pulse corresponding to S(m) (step 330), which in the present example is the 2 ms pulse, is applied. (step 340) Again, after the first erase pulse is applied, the sector being erased will be subjected to erase verify process. (step 350) If the sector fails the erase verify process, the erase pulse width will be incremented (step 360) and a pulse with the incremented pulse width is applied to erase all of the cells in the sector to be erased (step 370). This process will continue until the sector passes the erase verify process. However, the inventors have found that the number of erase pulses for each sector being erased after sector 0, will be fewer than the number of erase pulses required to erase sector 0.

If it is determined at step 380 that there are no other sectors to be erased, the erase operation ends.

It is noted that S(y) is constant for all sectors that need to be erased in the same FLASH memory. However, S(y) may be different for different FLASH memories, due to process variations which may be different from wafer to wafer. Also, since S(x) represents the number of times required to perform the "time stepping" operation on the first sector of the FLASH memory, its value remains constant for other sectors to be erased.

Figure 4:
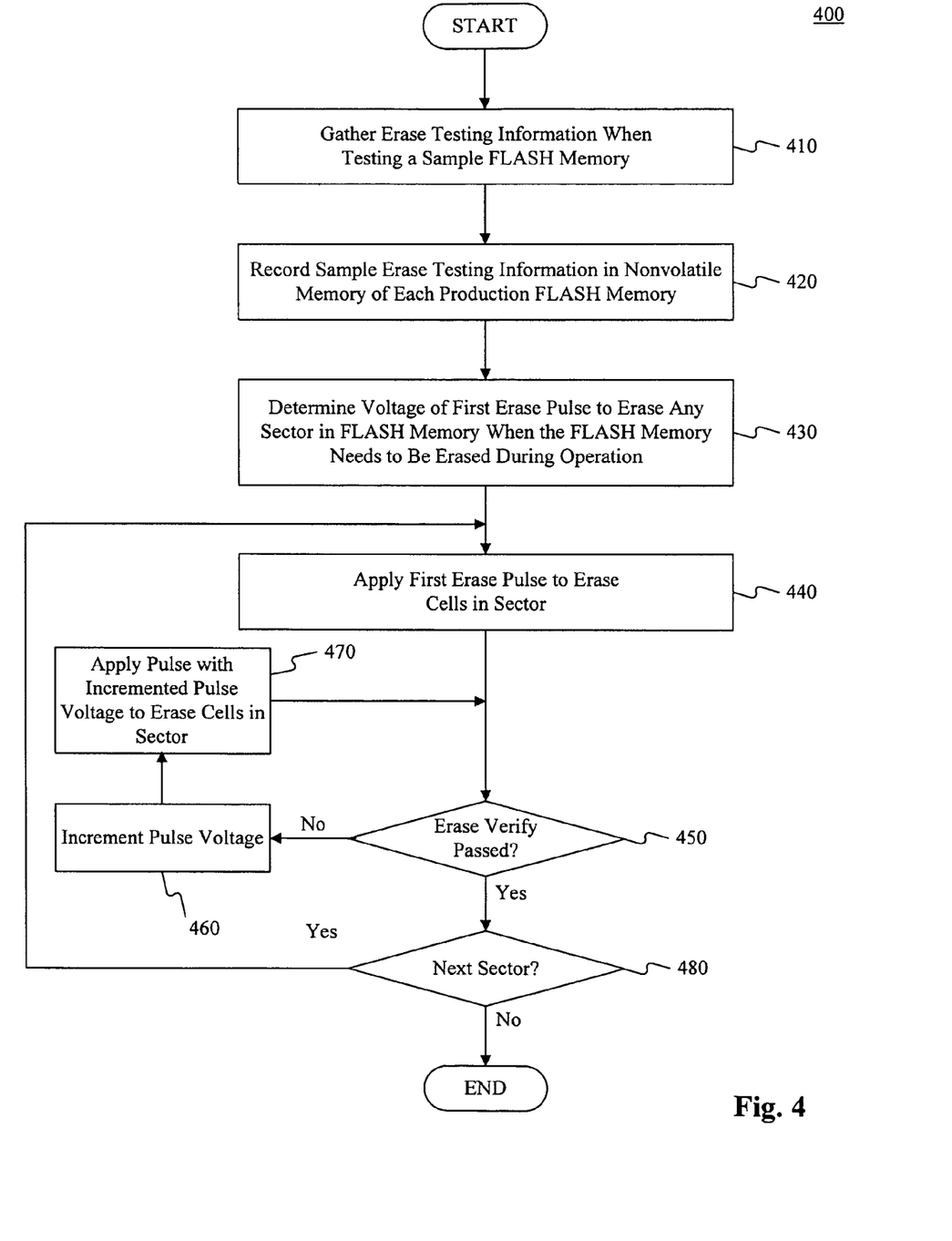
FIG. 4 is a diagram illustrating a flowchart of a sector erase operation used in a FLASH memory according to a third embodiment of the present invention.

FIG. 4 is a diagram illustrating a flowchart 400 of a sector erase operation used in a FLASH memory according to a third embodiment of the present invention. While manufacturing a FLASH memory, the functionality of the FLASH memory product is tested by erasing a predetermined number of sectors of a sample FLASH memory. The predetermined number may be all the sectors of the FLASH memory or a smaller number determined to be representative of the expected performance of the FLASH memory. In step 410, erase testing information of the sample FLASH memory is gathered by erasing the predetermined number of sectors of the sample FLASH memory during product testing. In the third embodiment, sectors of the sample FLASH memory are erased by performing the voltage stepping operation. The functionality of the FLASH memories being manufactured is tested by determining an appropriate number of sample FLASH memories per wafer and/or per production batch of wafers, in order to ensure any test results obtained from testing the sample(s) are acceptably representative of the wafer and/or batch of wafers. In step 410, the predetermined number of sectors of the sample FLASH memory or memories are erased during either the wafer sorting or package testing phase of manufacture. During sample testing, the erase testing information, which includes the number of times required to erase each of the predetermined number of sectors of the sample FLASH memory is gathered. The order of the erase pulses successively applied to erase each sector may also be gathered. The same initial voltage of erase pulse and the same increments of increase of voltage are applied, as necessary, to erase each sector. The erase verify process is applied after each erase voltage is applied, and the erase voltage is not incremented unless the sector being erased fails the erase verify process.

A different number of times may be required to perform the "voltage stepping" operation to erase different sectors of the sample FLASH memory or memories during product testing. However, it is the lowest number of voltage steps required for any sector tested that is determined from the testing. After gathering and evaluating the sample erase testing information to determine the least number of times required to erase any sector, that least number of times is recorded in a non-volatile memory physically integrated with each FLASH memory to which the sample testing applies (step 420). For example, that non-volatile memory may be a fuse register.

Thus, for example, a "voltage stepping" operation is performed to erase sectors of the sample FLASH memory during product testing. If the "voltage stepping" operation needs to be performed no fewer than four times to successfully erase any sector of the sample FLASH memory product(s) and the sequence of voltage steps of the erase pulses successively applied to erase the sector is 3 volts, 4 volts, 5 volts, and 6 volts, then the least number of times required to erase one sector of the FLASH memory, which is represented by N(z), is four. In this condition, the sample erase testing information includes the least number of times required to successfully erase a sector, which is 4 in the present example. As described above, this determination based on the sample testing information is recorded in the non-volatile memory associated with each FLASH memory to which the sample testing applies. For example, if the sample testing only applies to other FLASH memory chips on the same wafer, then the sample testing information is recorded in all of these chips. Alternatively, if the sample testing applies to chips produced from multiple wafers of a process batch, then the sample testing information is recorded in the non-volatile memories associated with the respective flash memories on all chips produced from the multiple wafers of the process batch. Without limitation, it is also consistent with the present invention to perform testing on, and derive erase testing for, every chip on a wafer.

In step 430, when any of the production FLASH memories needs to be erased during operation by a user, the magnitude of the first erase pulse and the manner of incrementing the voltage magnitude of successive erase pulses, as necessary, to erase the FLASH memory are determined according to the sample erase testing information stored in the non-volatile memory associated with the FLASH memory. For example, the first erase pulse to erase any sector of the FLASH memory, which is represented by N(n), may be determined by subtracting an assumed value N(y), which represents sector-to-sector erase speed difference, from N(z). In the example set forth above, N(z) is four and N(y) is set to be one. As a result, N(n)=N(z)−N(y)=3, so that the third erase pulse, which has a magnitude of 5 volts, is selected to be the first erase pulse to erase any sector of the FLASH memory.

In step 440, the FLASH memory sector is erased by applying the first erase pulse determined in step 430. In the present example, the first erase pulse applied to erase the FLASH memory sector is 5 volt. After that first 5 volt pulse is applied to erase the sector, that sector is subjected to the erase verify process (step 450). If the sector fails the erase verify process, the pulse voltage is incremented (step 460) by the same magnitude as was applied during sample testing, e.g., by 1 volt, so that the next voltage pulse will have a magnitude of 6 volts. Then, in step 470, that next 6 volt erase pulse is applied to all cells in the sector being erased.

If at step 450 the sector being erased passes the erase verify process, it is determined at step 480 whether any other sectors need to be erased. If there is another sector to be erased, the voltage of the first erase pulse to be applied has already been determined from the sample test data (in step 430), e.g., to be the voltage of the third erase pulse, and that voltage is applied to the cells of the next sector being erased (step 440).

If at step 480, it is determined that there are no further sectors to be erased, the erase process ends.

Figure 5:
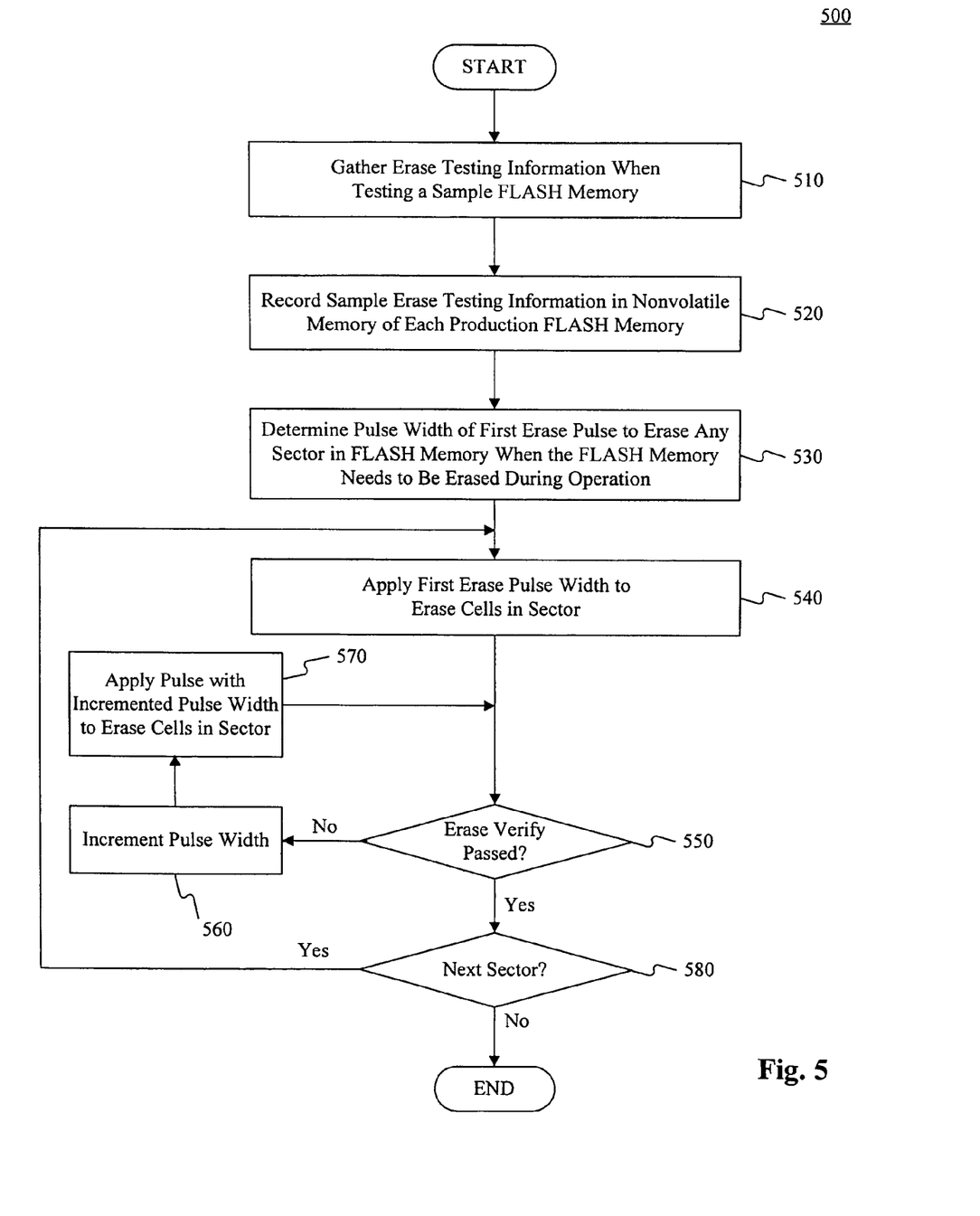
FIG. 5 is a diagram illustrating a flowchart of a sector erase operation used in a FLASH memory according to a fourth embodiment of the present invention.

FIG. 5 is a diagram illustrating a flowchart 500 of a sector erase operation used in a FLASH memory according to a fourth embodiment of the present invention. In step 510, erase testing information of one or more sample FLASH memory products is gathered by erasing a predetermined number of sectors of the sample FLASH memory product(s) during product testing. As in the case of the third embodiment, the predetermined number may be all sectors or a smaller number representative of the expected performance of the FLASH memory. Also in the fourth embodiment, the functionality of the FLASH memories being manufactured is determined by testing an appropriate number of sample FLASH memories per wafer and/or per production batch of wafers.

In the fourth embodiment, the sectors of each sample FLASH memory are erased by performing the "time stepping" operation. The erase testing information includes the number of times required to erase each sector and the respective pulse widths of the erase pulses successively applied to erase each sector. The same initial pulse width of erase pulse and the same increments of increase of pulse width are applied, as necessary, to erase each sector of the sample FLASH memory. The erase verify process is applied after each erase pulse is applied, and the erase pulse is not incremented unless the sector being erased fails the erase verify process.

A different number of pulses may be required to perform the "time stepping" operation to erase different sectors of the sample FLASH memory product(s) during product testing. However, it is the lowest number of erase pulses required for any sector tested that is determined from the testing. After gathering and evaluating the sample erase testing information to determine the least number of pulses required to successfully erase a sector, that least number of pulses is recorded in a non-volatile memory physically integrated with each FLASH memory to which the sample testing applies (step 520). For example, the non-volatile memory may be a fuse register.

Thus, for example, a "time stepping" operation is performed to erase sectors of one or more sample FLASH memory products during product testing. If the "time stepping" operation needs to be performed no fewer than four times to successfully erase any sector of the sample FLASH memory product(s) and the order of the pulse widths of the erase pulses successively applied to erase the sector is 500 us, 1 ms, 2 ms, and 4 ms, the least number of times required to erase one sector of the FLASH memory, which is represented by S(z), is four. In this condition, the sample erase testing information includes the least number of times required to successfully erase a sector, i.e., four, and the sequence of the pulse widths of the erase pulses, i.e., 500 us, 1 ms, 2 ms, and 4 ms. As explained above, this determination based on the sample testing information is recorded in the non-volatile memory associated with each FLASH memory to which the sample testing applies.

In step 530, when any of the production FLASH memories need to be erased during operation by a user, the pulse width of the first erase pulse and the manner of incrementing the pulse width of successive erase pulses, as necessary, to erase the FLASH memory are determined according to the sample erase testing information stored in the non-volatile memory associated with the FLASH memory. For example, the first erase pulse to erase any sector of the FLASH memory, which is represented by S(n), may be determined by subtracting an assumed value S(y), which represents sector-to-sector erase speed difference, from S(z). In the example set forth above, S(z) is four and S(y) is set to be one. As a result, S(n)=S(z)−S(y)=3, so that the third erase pulse, which has a width of 2 ms, is selected to be the first erase pulse to erase any sector of the FLASH memory.

In step 540, the production FLASH memory sector is erased by applying the first erase pulse determined in step 530. In the present example, the pulse width of the first erase pulse to erase the FLASH memory is 2 ms. After that first 2 ms erase pulse is applied to erase the sector, that sector is subjected to the erase verify process (step 550). If the sector fails the erase verify process, the pulse width is incremented (step 560) by the same magnitude as was applied during sample testing, e.g., according to a pulse width doubling progression, so that the next voltage pulse will have a pulse width of 4 ms. Then, in step 570, that next 4 ms erase pulse is applied to all cells in the sector being erased.

If at step 550 the sector being erased passes the erase verify process, it is determined at step 580 whether any other sectors need to be erased. If there is another sector to be erased, the pulse width of the first erase pulse to be applied has already been determined from the sample test data in step 530, e.g., to be the pulse width of the third pulse, and that erase pulse is the first pulse to be applied to the cells of the next sector being erased (step 540).

If at step 580, it is determined that there are no further sectors to be erased, the erase process ends.

In addition to erasing the FLASH memory in sectors by performing a sector erasing operation, methods consistent with the present invention, such as described above, can also be used to determine the order of erase pulses applied to erase all sectors of the FLASH memory when performing a chip erase operation.

In the embodiments disclosed herein, the initial erase pulse voltage or width is determined by performing a subtraction operation. However, embodiments consistent with the invention are not so limited. Persons skilled in the art will now appreciate that the erase condition information determined by erasing sector 0 (first and second embodiments) or the sample erase testing information (third and fourth embodiments), may be used in other ways to determine how to most effectively perform subsequent erase operations. Further, additional or different information may be collected as the erase condition information or the sample erase testing information.

In the embodiments disclosed herein, erase condition or test information recorded in memory includes the number of times required to erase any sector tested. However, embodiments consistent with the present invention are not so limited. Additional or different information can be recorded including, for example, the respective voltages or pulse widths of the sequence of erase pulses.

Although the voltage stepping erase operation disclosed herein increments successive voltage steps by 1 volt, embodiments consistent with the invention are not so limited. Other sequences of voltage steps may be used with equal effectiveness. Similarly, while in the time stepping erase operation disclosed herein each successive erase pulse width has a magnitude twice that of the previous pulse width, embodiments consistent with the present invention are not so limited. Other sequences of erase pulse widths may be used with equal effectiveness.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

We claim:

1. A sector erase method for use in a non-volatile memory including a plurality of memory cells in rows and columns, the non-volatile memory being divided into a plurality of sectors of the memory cells, comprising:
    erasing the memory cells of a first sector by applying a sequence of first erase pulses;
    recording erase condition information corresponding to the first sector, including a number of erase pulses of the sequence required to erase the memory cells of the first sector;
    determining an initial second erase pulse to erase the memory cells of a second sector according to the erase condition information; and
    erasing the memory cells of the second sector by, initially, applying the initial second erase pulse.

2. The method of claim 1, wherein respective voltage magnitudes of the sequence of first erase pulses increase.

3. The method of claim 1, wherein the respective pulse widths of the sequence of first erase pulses increase.

4. The method of claim 1, wherein determining an initial second erase pulse includes:
    subtracting an assumed integer value from the number of erase pulses required to erase the memory cells of the first sector, wherein the assumed value represents a sector-to-sector erase speed difference and a difference result of the subtracting is n; and
    selecting the $n^{th}$ one of the first erase pulses of the sequence of first erase pulses to be the initial second erase pulse.

5. The method of claim 1, wherein erasing the memory cells of the first sector includes:
    applying a first erase pulse of the sequence;
    performing an erase verify process to determine if a sufficient number of the memory cells of the first sector have been erased to pass the erase verify process;
    applying a next erase pulse of the sequence of first erase pulses to erase the memory cells of the first sector if the memory cells of the first sector fail the erase verify process; and
    repeating the performing and applying until the memory cells of the first sector pass the erase verify process,
    wherein each successive erase pulse in the sequence of first erase pulses is greater than an immediately preceding erase pulse in the sequence by one of voltage magnitude and pulse width.

6. The method of claim 5, wherein determining an initial second erase pulse includes:
    subtracting an assumed integer value from the number of erase pulses required to erase the memory cells of the first sector, wherein the assumed value represents a sector-to-sector erase speed difference and a difference result of the subtracting is n; and
    selecting the $n^{th}$ one of the first erase pulses of the sequence of first erase pulses to be the initial second erase pulse.

7. The method of claim 6 further including:
    performing the erase verify process to determine if a sufficient number of the memory cells of the second sector have been erased to pass the erase verify process; and
    applying an $(n+1)^{th}$ erase pulse of the sequence of first erase pulses to erase the memory cells of the second sector if the memory cells of the second sector fail the erase verify process.

8. The method of claim 1, wherein the non-volatile memory is a FLASH memory.

9. A method for manufacturing a production non-volatile memory, each of the production memory and a sample non-volatile memory including a plurality of memory cells in rows and columns, the non-volatile memory being divided into a plurality of sectors of the memory cells, comprising:
    gathering erase testing information corresponding to a predetermined number of sectors of the sample non-volatile memory by erasing the memory cells of each of the predetermined number of sectors by applying a sequence of erase pulses to erase the memory cells of each sector, wherein the erase testing information includes a number of times, equal to a number of the erase pulses applied, that is required to erase the memory cells of each of the predetermined number of sectors of the sample non-volatile memory; and
    recording in the production non-volatile memory sample erase test result information including a least number of times required to erase any one of the predetermined number of sectors of the sample non-volatile memory.

10. The method of claim 9, wherein respective voltage magnitudes of the sequence of erase pulses increase.

11. The method of claim 9, wherein respective pulse widths of the sequence of erase pulses increase.

12. The method of claim 9, wherein erasing the memory cells of each of the predetermined number of sectors includes:
    applying a first erase pulse of the sequence;
    performing an erase verify process to determine if a sufficient number of the memory cells of the sector have been erased to pass the erase verify process;
    applying a next erase pulse of the sequence of erase pulses to erase the memory cells of the sector if the memory cells of the sector fail the erase verify process; and
    repeating the performing and applying until the memory cells of the sector pass the erase verify process,
    wherein each successive erase pulse in the sequence of erase pulses is greater than an immediately preceding erase pulse in the sequence by one of voltage magnitude and pulse width.

13. The method of claim 9, wherein the non-volatile memory is a FLASH memory.

14. A method for erasing a production non-volatile memory, having stored in association therewith erase test result information of a sample non-volatile memory, each of the production memory and the sample memory including a plurality of memory cells in rows and columns and being divided into a plurality of sectors of the memory cells, the erase test result information including a number equal to a least number of erase pulses from a sequence of erase pulses required to erase any one of a predetermined number of the sectors of the sample non-volatile memory, the method comprising:
    determining an initial erase pulse to erase memory cells of a sector of the production memory according to the stored sample erase test result information; and
    erasing the memory cells of, at least, a predetermined one of the sectors of the production non-volatile memory by, initially, applying the initial erase pulse.

15. The method of claim 14, wherein respective voltage magnitudes of the sequence of erase pulses increases.

16. The method of claim 14, wherein respective pulse widths of the sequence of erase pulse increases.

17. The method of claim 14, wherein determining an initial erase pulse includes:

subtracting an assumed integer value from the number equal to the least number of erase pulses from the sequence of erase pulses required to erase any one of the predetermined number of sectors of the sample non-volatile memory, wherein the assumed value represents a sector-to-sector erase speed difference, and a difference resulting from the subtracting is n; and selecting the $n^{th}$ one of the erase pulses in the sequence to be the initial erase pulse.

* * * * *